United States Patent
Carlson-Sypek et al.

(10) Patent No.: US 12,148,730 B2
(45) Date of Patent: Nov. 19, 2024

(54) IN-PROCESS WIRE BOND TESTING USING WIRE BONDING APPARATUS

(71) Applicant: Atieva, Inc., Newark, CA (US)

(72) Inventors: Ben Carlson-Sypek, Chandler, AZ (US); DodgieReigh M. Calpito, Fairfield, CA (US); Ryan Simpson, Maricopa, AZ (US)

(73) Assignee: Atieva, Inc., Newark, CA (US)

(*) Notice: Subject to any disclaimer, the term of this patent is extended or adjusted under 35 U.S.C. 154(b) by 408 days.

(21) Appl. No.: 17/646,586

(22) Filed: Dec. 30, 2021

(65) Prior Publication Data
US 2023/0215835 A1  Jul. 6, 2023

(51) Int. Cl.
*H01L 23/00* (2006.01)
*H01L 21/66* (2006.01)

(52) U.S. Cl.
CPC ............ *H01L 24/78* (2013.01); *H01L 22/14* (2013.01); *H01L 24/85* (2013.01); *H01L 2224/7855* (2013.01); *H01L 2224/78611* (2013.01); *H01L 2224/789* (2013.01); *H01L 2224/851* (2013.01); *H01L 2224/859* (2013.01)

(58) Field of Classification Search
CPC ............ H01L 24/45; H01L 24/78–79; H01L 24/85–86; H01L 2224/851; H01L 2224/7855; G01R 31/2853; G01R 31/2812; B23K 20/004; B23K 31/125
USPC .......................................................... 438/17
See application file for complete search history.

(56) References Cited

U.S. PATENT DOCUMENTS

| | | | |
|---|---|---|---|
| 3,840,169 A | 10/1974 | Steranko et al. | |
| 4,771,930 A * | 9/1988 | Gillotti | H01L 24/85 228/180.5 |
| 5,468,927 A * | 11/1995 | Terakado | B23K 20/007 228/179.1 |
| 6,085,962 A | 7/2000 | Jacobson et al. | |
| 6,117,693 A | 9/2000 | Fogal et al. | |
| 6,247,629 B1 * | 6/2001 | Jacobson | H01L 24/85 228/104 |
| 2008/0164896 A1 * | 7/2008 | Beaman | H01L 25/0652 324/755.02 |
| 2009/0127316 A1 * | 5/2009 | Siepe | H01L 24/85 228/49.5 |
| 2013/0341377 A1 * | 12/2013 | Cheng | H01L 24/85 228/4.5 |
| 2014/0103096 A1 | 4/2014 | Zhang et al. | |
| 2015/0076712 A1 * | 3/2015 | Cristaldi | H01L 24/03 257/781 |

(Continued)

FOREIGN PATENT DOCUMENTS

CN  103730390 A  4/2014

OTHER PUBLICATIONS

International Search Report and Written Opinion for PCT Application No. PCT/US2022/082522, mailed on Mar. 16, 2023, 15 pages.

*Primary Examiner* — Didarul A Mazumder
(74) *Attorney, Agent, or Firm* — Brake Hughes Bellermann LLP

(57) ABSTRACT

In a general aspect, a wire bonding apparatus can include a supply of bond wire, a wire bonding head, and an electrical continuity tester. The wire bonding head can including a wire cutter. The wire cutter can be electrically conductive. The electrical continuity tester can be coupled between the supply of bond wire and the wire cutter.

14 Claims, 4 Drawing Sheets

(56) References Cited

U.S. PATENT DOCUMENTS

| | | | |
|---|---|---|---|
| 2015/0200143 A1* | 7/2015 | Gillotti | H01L 22/12 |
| | | | 228/104 |
| 2016/0351537 A1* | 12/2016 | Sekine | H01L 24/85 |
| 2022/0020717 A1* | 1/2022 | Xia | H01L 24/85 |

* cited by examiner

IN-PROCESS WIRE BOND TESTING USING WIRE BONDING APPARATUS

TECHNICAL FIELD

This document relates to in-process testing of wire bonds.

BACKGROUND

Bond wires are used to electrically interconnect different elements or components in electrical device assemblies. In such assemblies, improperly or poorly formed bond wire electrical interconnections can introduce unwanted electrical resistance and/or can cause other functionality issues.

SUMMARY

In a general aspect, a wire bonding apparatus can include a supply of bond wire, a wire bonding head, and an electrical continuity tester. The wire bonding head can include a wire cutter. The wire cutter can be electrically conductive. The electrical continuity tester can be coupled between the supply of bond wire and the wire cutter.

Implementations can include one or more of the following features. For example, the supply of bond wire can be electrically coupled with electrical ground. The supply of bond wire can be electrically coupled with electrical ground via a spool having the supply of bond wire disposed thereon.

The supply of bond wire can be electrically floating.

The wire bonding apparatus be configured to, after forming a wire bond on a contact surface, electrically contact the contact surface with the wire cutter, and with the wire cutter electrically contacting the contact surface, measure a resistance between the contact surface and the supply of bond wire with the electrical continuity tester. The wire bond can be a first wire bond of a bond wire electrical interconnect, and the wire bonding apparatus can be configured to indicate a wire bonding failure if the measured resistance is greater than a threshold resistance. The wire bond can be a last wire bond of a bond wire electrical interconnect, and the wire bonding apparatus is configured to: perform, with the wire cutter after formation of the wire bond, a wire cutting operation; and indicate a wire bonding failure if the measured resistance is less than a threshold resistance.

In another general aspect, a method for operating a wire bonding apparatus can include forming, from a supply of bond wire included in the wire bonding apparatus, a wire bond on a contact surface. The method can also include electrically contacting the contact surface with a wire cutter included in a wire bonding head of the wire bonding apparatus. The wire cutter can be electrically conductive. The method can also include measuring, with a continuity tester included in the wire bonding apparatus, a resistance between the contact surface and the supply of bond wire. The method can still further include determining, based on the measured resistance, success or failure of the forming of the wire bond.

Implementations can include one or more of the following features. For example, the supply of bond wire can be electrically coupled with electrical ground, and measuring the resistance can include measuring a resistance between the wire cutter and electrical ground.

The supply of bond wire can be electrically floating.

The wire bond can be a first wire bond of a bond wire electrical interconnect. Determining success or failure of the forming of the wire bond can include determining success of the forming of the wire bond if the measured resistance is less than or equal to a threshold resistance; and determining failure of the forming of the wire bond if the measured resistance is greater than the threshold resistance.

The wire bond can be a last wire bond of a bond wire electrical interconnect. Determining success or failure of the forming of the wire bond can include determining success of the forming of the wire bond if the measured resistance is greater than or equal to a threshold resistance; and determining failure of the forming of the wire bond if the measured resistance is less than the threshold resistance.

In another general aspect, a method for operating a wire bonding apparatus can include forming, from a supply of bond wire included in the wire bonding apparatus, a first wire bond of a bond wire electrical interconnect. The first wire bond can be formed on a first contact surface. The method can also include electrically contacting the first contact surface with a wire cutter included in a wire bonding head of the wire bonding apparatus. The wire cutter can be electrically conductive. The method can further include measuring, with a continuity tester included in the wire bonding apparatus, a resistance between the first contact surface and the supply of bond wire. The method can still further include determining, based on the measured resistance between the first contact surface and the supply of bond wire being less than a first threshold resistance, success of the forming of the first wire bond. The method can also include forming, from the supply of bond wire, a last wire bond of the bond wire electrical interconnect, the last wire bond being formed on a second contact surface. The method can still further include performing a wire cutting operation on the bond wire electrical interconnect, electrically contacting the second contact surface with the wire cutter, and measuring, with the continuity tester, a resistance between the second contact surface and the supply of bond wire. The method can also further include determining, based on the measured resistance between the second contact surface and the supply of bond wire being greater than a second threshold resistance, success of the forming of the last wire bond.

Implementations can include one or more of the following features. For example, the method can include, after forming the first wire bond and prior to electrically contacting the first contact surface with the wire cutter, positioning a bonder head of the wire bonding apparatus such that the wire cutter is spaced from the first wire bond when electrically contacting the first contact surface.

The method can include, after forming the last wire bond and prior to electrically contacting the second contact surface with the wire cutter, positioning a bonder head of the wire bonding apparatus such that the wire cutter is spaced from the last wire bond when electrically contacting the second contact surface.

The supply of bond wire can be electrically grounded. The supply of bond wire can be electrically floating.

BRIEF DESCRIPTION OF DRAWINGS

In the drawings, which are not necessarily drawn to scale, like reference symbols may indicate like and/or similar components (elements, structures, etc.) in different views.

Figure 1:
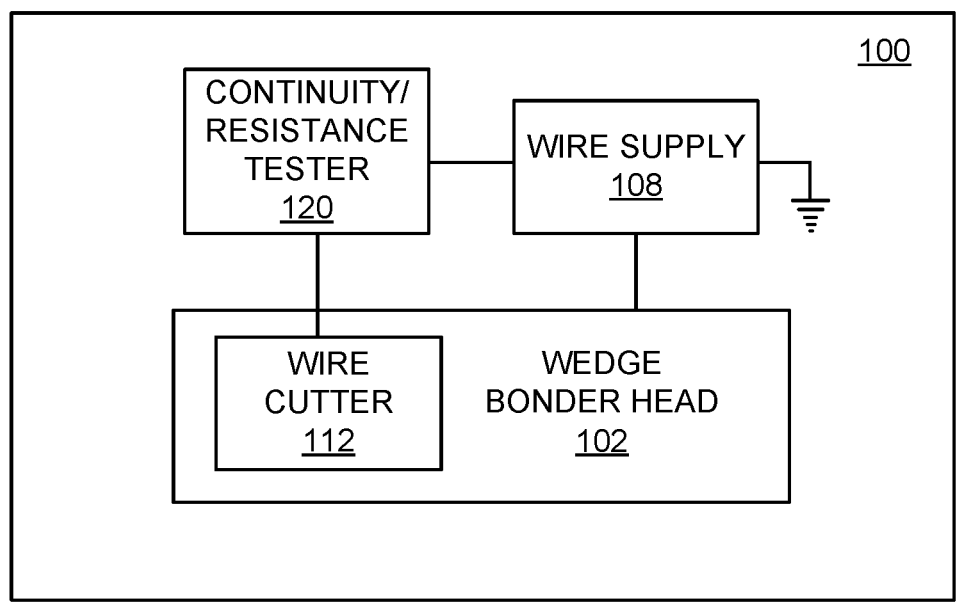
FIG. 1 is a block diagram illustrating an example wedge wire bonder for performing in-process wire bond testing.

The drawings illustrate generally, by way of example, but not by way of limitation, various implementations discussed in the present disclosure. Reference symbols shown in one drawing may or may not be repeated for the same, and/or similar elements in related views. Further, reference symbols that are repeated in multiple drawings may not be specifically discussed with respect to each of those drawings, but are provided for context between related views. Also, not all like elements in the drawings may be specifically referenced with a reference symbol when multiple instances of an element are illustrated.

DETAILED DESCRIPTION

This document describes examples of systems and techniques directed to testing wire bonds (e.g., wedge wire bonds) during a wire bonding process, which may be referred to as in-process wire bond testing. For instance, using the approaches described herein, success or failure of wire bonds can be determined based on a continuity check and/or resistance measurement that is performed after forming a wire bond. In example implementations, success or failure of a wire bond can be determined based on a comparison of a measure resistance to a threshold value. The details of such comparisons will depend on the particular implementation, such as whether the wire bond is a first bond of a bond wire electrical interconnection, or a last (second, or subsequent) wire bond of a bond wire electrical interconnection.

Examples herein refer to bond wires (e.g., ribbon bond wires or ribbon wires). As used herein, a bond wire can have any number of different geometries, and can include one or more materials having respective conductivities. For instance, a bond wire can be a single layered bond wire, or can be a multi-layered bond wire that has a plurality of layers each having a respective conductivity. In some implementations, a bond wire can be a ribbon wire having a rectangular cross-section and having one or more layers. The one or more layers can include one or more electrically conductive materials, such as one or more metals and/or metal alloys. As used herein, a bond wire being coupled to a surface (e.g., a conductive surface, electrical contact surface, etc.) refers to the bond wire being electrically and/or physically coupled with that surface, unless otherwise indicated.

Examples herein refer to segments of a bond wire (e.g., bond wire segments). As used herein, a bond wire segment is a portion of a bond wire that extends between separate wire bonds (e.g., wedge wire bonds). For instance, in some implementations, a bond wire (e.g., a continuous bond wire) can include a first bond wire segment extending between a first wire bond and a second wire bond, and further include a second segment extending between the second wire bond and a third wire bond.

Examples herein refer to wire loops. As used herein, a wire loop can be part of bond wire segment that extends between two wedge wire bonds. For instance, a wire loop can electrically connect a first wedge wire bond and its corresponding electrical contact surface with a second wedge wire bond and its corresponding electrical contact surface. In implementations, a wire loop can be flat, curved, arced, or a combination thereof.

Examples herein refer to electrochemical cells. As used herein, an electrochemical cell is a device that generates electrical energy from chemical reactions, or uses electrical energy to cause chemical reactions, or both. An electrochemical cell can include an electrolyte and two electrodes to store energy and deliver it when used. In some implementations, the electrochemical cell can be a rechargeable cell. For example, the electrochemical cell can be a lithium-ion cell. In some implementations, the electrochemical cell can act as a galvanic cell when being discharged, and as an electrolytic cell when being charged. The electrochemical cell can have at least one terminal for each of the electrodes. The terminals, or at least a portion thereof, can be positioned at one end of the electrolytic cell. For example, when the electrochemical cell has a cylindrical shape, one of the terminals (e.g., a first terminal) can be provided in the center of an end of the cell, and the can that forms the cylinder can constitute the other terminal and therefore be present at the end including the first terminal as well (e.g., as a rim at the end of the cell). Other shapes of electrochemical cells can be used, including, but not limited to, prismatic shapes.

Examples herein refer to a battery module, which is an individual component configured for holding and managing multiple electrochemical cells during charging, storage, and use. The battery module can be intended as the sole power source for one or more loads (e.g., electric motors), or more than one battery module of the same or different type can be used. Two or more battery modules can be implemented in a system separately or as part of a larger energy storage unit. For example, a battery pack can include two or more battery modules of the same or different type. A battery module can include control circuitry for managing the charging, storage, and/or use of electrical energy in the electrochemical cells, or the battery module can be controlled by an external component. For example, a battery management system can be implemented on one or more circuit boards (e.g., a printed circuit board).

Examples herein refer to a busbar, where a corresponding battery module can have at least one busbar. The busbar is electrically conductive and is used for conducting electricity to the electrochemical cells when charging, or from the cells when discharging. The busbar is made of an electrically conductive material (e.g., metal) and has suitable dimensions considering the characteristics of the electrochemical cells and the intended use. In some implementations, the busbar comprises aluminum (e.g., an aluminum alloy). A busbar can be planar (e.g., flat) or can have one or more bends, depending on the shape and intended use of the battery module.

Examples herein refer to a continuity tester and/or a resistance measurement circuit. For purposes of this disclosure, these terms can be used interchangeably to refer to an instrument, or circuit that is configured to measure an electrical resistance, such as by applying a current and measuring a voltage, and/or by applying a voltage and measuring a current. For instance, a continuity tester and/or resistance measurement circuit can include an ohmmeter.

Examples herein may refer to a top or a bottom. These, and similar expressions, identify things or aspects in a relative way, e.g., based on an express or arbitrary notion of perspective. That is, these terms are illustrative only, used for purposes of explanation, and do not necessarily indicate the only possible position, direction, orientation, and so on.

FIG. 1 is a block diagram illustrating an example wedge wire bonder (bonder) 100 for performing in-process wire bond testing. The bonder 100 can be used to form wire bond electrical interconnects including a plurality of wedge wire bonds (e.g., ultrasonically-welded wire bonds) on one or more contact surfaces, and test those bonds during the wire bonding process for success or failure, e.g., using continuity testing and/or resistance measurements. Wire bonder 100 is shown as an example, and wire bonders having other configurations can be used to implement in-process wire bond testing in accordance with the present disclosure.

As shown in FIG. 1, the wire bonder 100 includes a wedge bonder head (bonder head) 102, a continuity/tester (tester) 120, and a wire supply 108. The bonder head 102 includes a wire cutter (cutter) 112, which can be used to sever a bond wire before, during, or after forming one more wire bonds. For example, the cutter 112 can be made of metal, and be electrically conductive. The tester 120 can be a circuit that is configured to check for electrical continuity (e.g., measure electrical resistance), which can include comparing a measured resistance to one or more threshold values to test for success or failure of a wire bond, such as in the approaches described herein. For instance, in some implementations, the tester 120 can include an ohmmeter circuit, and/or control logic (e.g., implemented in hardware, firmware or software) for comparing a measured resistance to the one or more thresholds.

The wire supply 108 can be a spool of bond wire, where the spool can include a spindle on which the bond wire is wound, and fed from when forming wire bonds. In some implementations, the bond wire spool and/or the spindle can be made of metal and be electrically conductive. As shown in FIG. 1, the tester 120 can be coupled between the wire cutter 112 and the wire supply 108. That is, a first terminal of the tester 120 can be electrically coupled with the wire cutter 112, and a second terminal of the tester 120 can be coupled with the wire supply 108.

Accordingly, the tester 120, in the bonder 100, can test for electrical continuity and/or measure electrical resistance between the wire cutter 112 (e.g., an electrically conductive surface, or an electrical contact surface that the wire cutter 112 is in contact with) and the wire supply 108. Depending on the specific implementation, the tester 120 (e.g., second terminal of the tester 120) can be electrically coupled directly with the bond wire wound on the spindle, and/or can be indirectly electrically coupled with the bond wire via the spindle (or the associated spool). In the example of FIG. 1, the wire supply 108 is coupled with electrical ground. In such implementations, the tester 120 can test for continuity and/or measure electrical resistance between the wire cutter 112 (or an electrically conductive surface the cutter is in contact with) and electrical ground. In other implementations, the wire supply 108 can be electrically floating. In some implementations, the wire supply 108 can be coupled to electrical ground at a beginning of the wire supply 108, such as where the wire supply 108 connects to an associated spindle or spool. For instance, the spindle or spool can be coupled with electrical ground and the wire supply 108 is grounded via the spindle and/or spool. In other implementations, the wire supply can be coupled with electrical ground proximate the bonder head 102 and/or the wire cutter 112.

Figure 2:
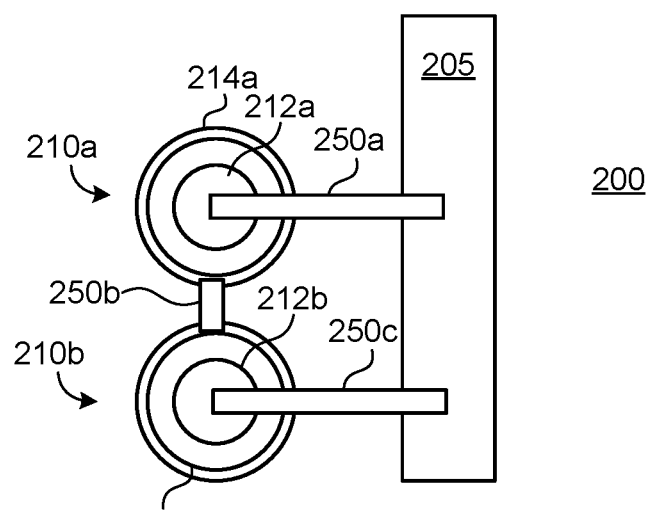
FIG. 2 is a diagram schematically illustrating an example of a battery pack module.

FIG. 2 is a diagram schematically illustrating an example of a battery pack module (module) 200 that can be produced using the in-process wire bond testing approaches described herein. In some implementations, the module 200 can be combined with (integrated with) other battery modules, e.g. to form a larger battery (e.g., a battery pack), such as for providing power to an electric motor. For instance the approaches described herein can be used to form wire bond electrical interconnections between the elements of the module 200, e.g., such as between a bus bar 205 and electrochemical cells 210a and 210b, and between the electrochemical cells 210 and 210b. The specific wire bond electrical interconnections shown in FIG. 2 are given by way of example, and other wire bond electrical interconnections can be formed using the approaches described herein, e.g., between different elements in the battery pack module 200, as electrical interconnections in an associated battery pack, or as electrical interconnections in other electrical device assemblies.

As shown in FIG. 2, the module 200 includes the busbar 205, the electrochemical cell 210a, and the electrochemical cell 210b. The electrochemical cell 210a includes a (first) terminal 212a and a rim 214a (e.g., part of a second terminal of the cell 210a), while the electrochemical cell 210b includes a (first) terminal 212b and a rim 214b (e.g., part of a second terminal of the cell 210a). As shown in FIG. 2, the busbar 205 is electrically coupled with the terminal 212a of the electrochemical cell 210a and the terminal 212b of the electrochemical cell 210b via respective bond wire electrical interconnections 250a and 250c, which can have associated wedge bonds (e.g., at each end of their respective bond wires). As further shown in FIG. 2, the rim 214a of the electrochemical cell 210a is electrically coupled with the rim 214b of the electrochemical cell 210b via a wire bond electrical interconnection 250b, where a corresponding bond wire can be wedge bonded to the rims 214a and 214b.

FIG. 3A-3D are diagrams schematically illustrating an example wire bonding process that includes in-process wire bond testing. In some implementations, the process shown in FIGS. 3A-3D can be implemented with a wire bonder in accordance with the bonder 100 shown in FIG. 1. In this example, the elements of a wire bonder (e.g., an implementation of the wire bonder 100) are referenced using 300 series reference numbers.

In this example, the wire bonder implementing the wire bonding process illustrated by FIGS. 3A-3D includes a wedge wire bonder head (bonder head) 300. The bonder head 300 includes a wire guide 304 that is used for guiding (e.g., feeding) a bond wire 302 from wire supply 308 (e.g., bond wire wound on a spindle 309 of an associated spool). The wire guide 304 can be made of one or more materials, including, but not limited to, a metal or a synthetic material. The bond wire 302 (e.g., which is fed from the wire supply 308) is illustrated as passing through the wire guide 304. In some implementations, the spindle 309 (and an associated spool) can be rotatably suspended in relation to wire bonder head 300, so as to allow the bond wire 302 to be obtained from the wire supply 308, via the wire guide 304, in a continuous or intermittent fashion, and such that the bond wire 302 has a particular orientation relative to, e.g., an electrochemical cell, busbar, or other electrical contact surface for bonding, e.g., based on a direction of travel between forming wire bonds.

The bonder head 300 also includes a wedge 310. The wedge 310 can be used to bond the ribbon bond wire 302 to electrical contact surfaces (e.g., contact surfaces 305a and 305b in this example), such as the electrical contact surfaces described herein. In an example implementation, the wedge 310 can be made of metal.

The wire bonder head 300 also includes a wire cutter (cutter) 312. The cutter 312 can be used to sever the ribbon wire 302 before, during, or after bonding. For example, as noted above with respect to the cutter 112 of FIG. 1, the cutter 312 can be made of metal and be electrically conductive.

As also shown in FIGS. 3A-3D, a continuity/resistance tester (tester) 320 can have a first terminal (e.g., lead, test lead, etc.) that is electrically coupled with the cutter 312, and a second terminal that is coupled with the wire supply 308. As described herein, the second terminal of the tester 320 can be electrically coupled with the bond wire 302 of the wire supply 308 in various ways, such as directly or indirectly. The cutter 312, as described herein, contact surfaces on which wire bonds are formed to facilitate testing of those wire bonds using the tester 320, and any other associated control logic and elements of the corresponding wire bonder.

For instance, while not specifically shown in FIGS. 3A-3D, a wire bonder used to implement the associated wire bonding process can include a number of other elements and/or systems, such as computer controlled motors for positioning the bonder head 300 during the illustrated process, and associated control logic, e.g., for controlling (moving, positioning, operating, etc.) the various elements of the bonder to implemented the process of FIGS. 3A-3D.

Figure 3A:
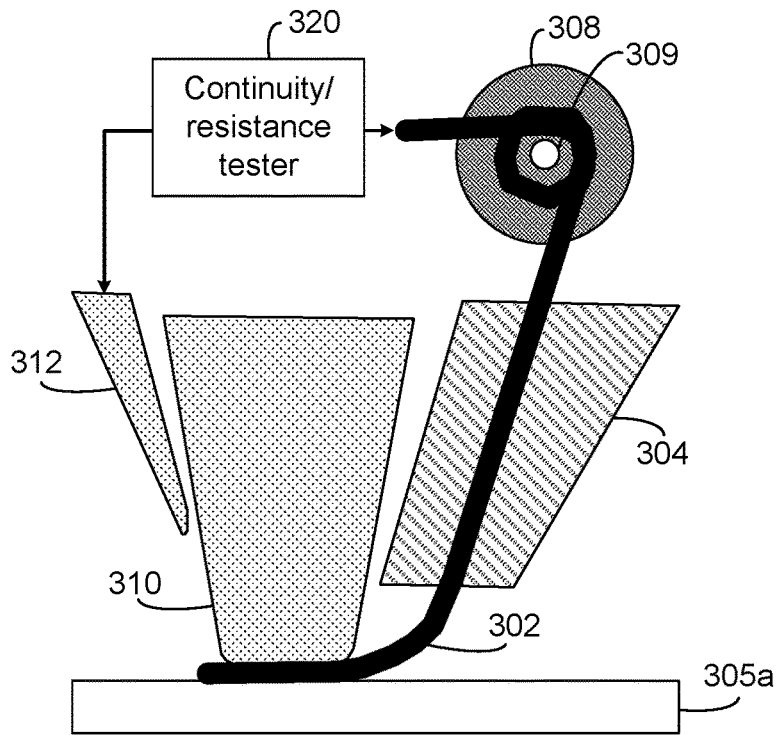
FIG. 3A-3D are diagrams schematically illustrating an example wire bonding process including in-process wire bond testing.

Referring to FIG. 3A, in this example, after positioning the bonder head over the contact surface 305a, a portion of the bond wire 302 can be fed, from the wire supply 308 through the wire guide 304, under the wedge 310. The wedge 310 can be lowered onto the portion of the bond wire 302, such that the portion of the bond wire 302 is between the wedge 310 and the contact surface 305a. The wedge 310 can then form (e.g., using ultrasonic energy provided by a transducer included in the wire bonder) a wire bond between the portion of the bond wire 302 under the wedge 310 and the contact surface. As shown in FIG. 3A, during formation of the wire bond, the cutter 312 is not in contact with the contact surface 305a. Accordingly, the tester 320 should detect an open circuit (e.g., no electrical continuity) between its first terminal (the cutter 312) and its second terminal (the wire supply 308). If an open circuit is not detected by the tester 320 with cutter 312 positioned as shown in FIG. 3A, this can indicate a wire bonding failure or a fault in an associated wire bonder. In this event, the wire bonder may, using its control logic, cease operation so that a root cause of the failure and/or fault can be determined and corrected.

Figure 3B:
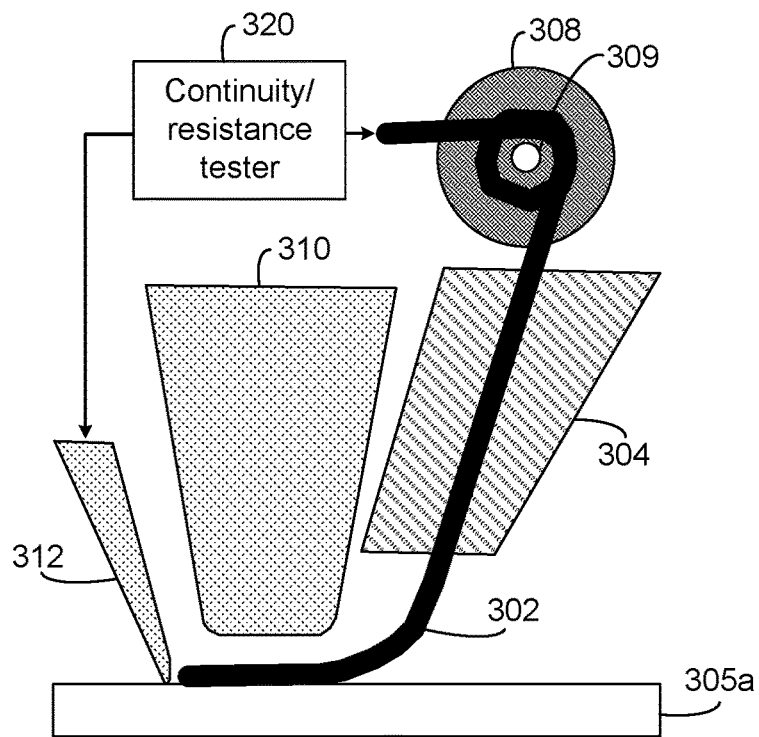

Referring to FIG. 3B, after forming the wire bond in FIG. 3A, the cutter 312 can be lowered onto, and make electrical contact with the contact surface 305a (with or without moving the bonder head 300 prior to lowering the cutter 312, so as to space the cutter 312 from the bond wire 302). As illustrated in FIG. 3B, the tester 320 can then be used to detect (via the cutter 312) whether there is electrical continuity (e.g., low electrical resistance) between the contact surface 305a and the wire supply 308. In an example implementation, a resistance measured by the tester 320 can be compared (e.g., by the tester 320 or other control logic of the associated wire bonder) with a threshold resistance value. If the measured resistance is less than (or equal to the threshold), the tester 320 (or other control logic) can determine that the wire bond of FIG. 3A was successfully formed, and the wire bonding process can continue. If, however, electrical continuity (a resistance below, or at a threshold value) is not detected by the tester 320 with the cutter 312 positioned as shown in FIG. 3B, this can indicate a wire bonding failure, or a fault in the associated wire bonder. In this event, the wire bonder may, in response to a failure indication from the tester 320 and/or using its control logic, cease operation so that a root cause of the failure and/or fault can be determined and corrected.

Figure 3C:
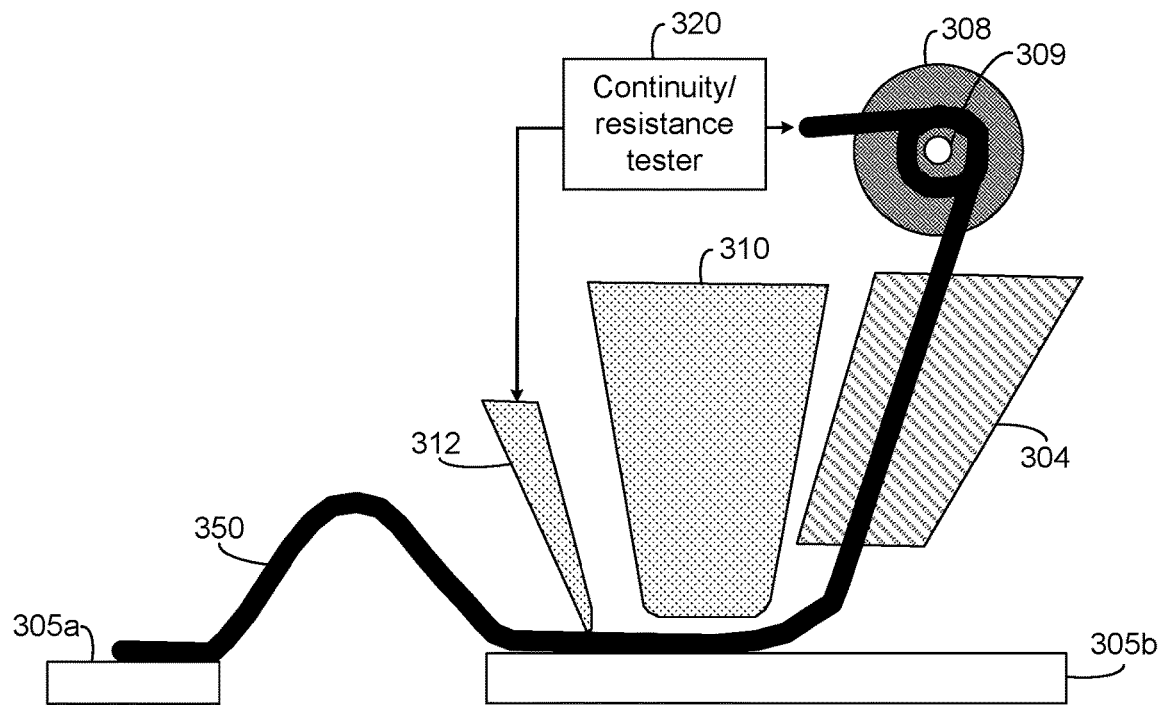

Referring to FIG. 3C, after the wire bond to contact surface 305a is determined to have been successful, the cutter 312 can be raised off the contact surface 305a, and the bonder head 300 can be moved to a position over a second electrical contact surface, e.g., the contact surface 305b. The bond wire 302 can be fed through the wire guide 304 while (or as a result of) moving the bonder head, so as to define the bond wire electrical interconnect, including a wire loop between the contact surface 305a and the contact surface 305b. The wedge 310 can then be lowered onto the bond wire 302 and a wire bond (e.g., second wire bond, last wire bond of the wire bond electrical interconnect 350) can be formed between the bond wire 302 and the contact surface 305b. As shown in FIG. 3C, after forming the wire bond to with the contact surface 305b, that cutter 312 can be lowered onto the bond wire 302 and used to sever the bond wire 302 to complete the bond wire electrical interconnection 350. In some implementations, additional wire bonds to the contact surface 305a and 305b, and/or other contact surfaces can be included in the bond wire electrical interconnection 350. For instance, in some implementations, a bond wire electrical interconnection can include three or more wire bonds.

Figure 3D:
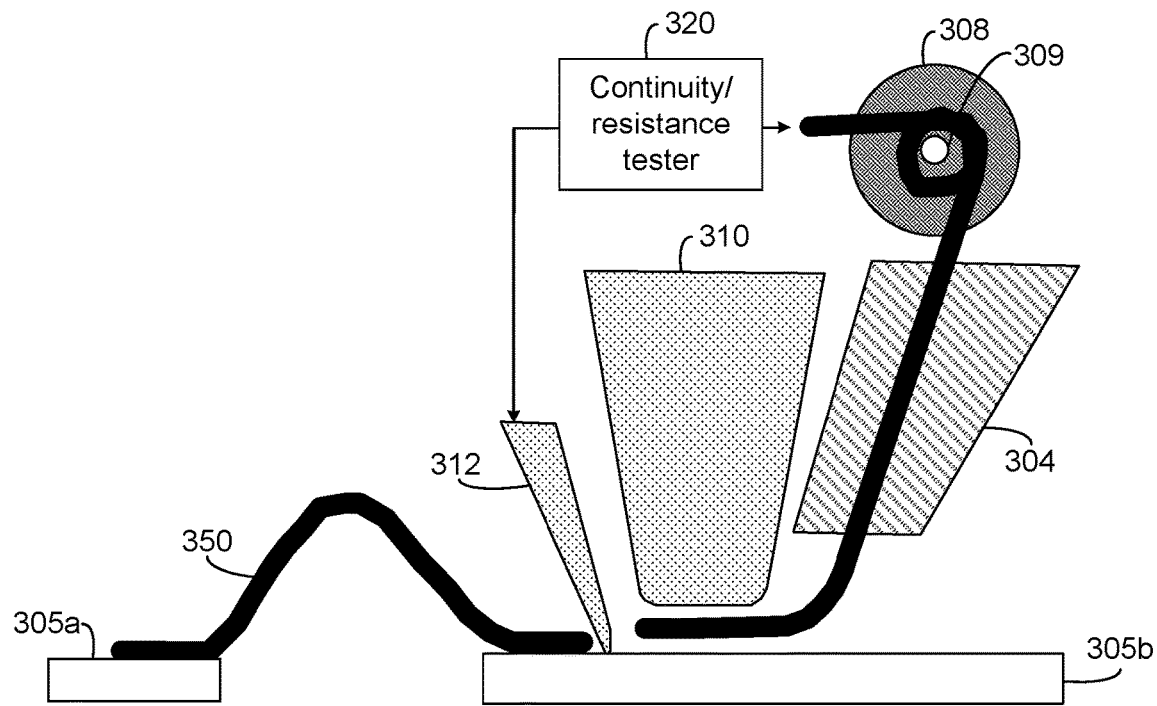

Referring to FIG. 3D, after forming the wire bond of FIG. 3C (and severing the bond wire 302, as illustrated in FIG. 3D), the cutter 312 can be lowered onto, and make electrical contact with the contact surface 305c (with or without moving the bonder head 300 prior to lowering the cutter 312, so as to space the cutter 312 from the bond wire 302). As illustrated in FIG. 3D, the tester 320 can then be used to detect (via the cutter 312) whether there is an open circuit (e.g., no electrical continuity) between the contact surface 305b and the wire supply 308. In an example implementation, a measured resistance can be compared (e.g., by the tester 320 or other control logic of the associated wire bonder) with a threshold resistance value (a same or different threshold resistance value than discussed with respect to FIG. 3B). If the measured resistance is greater than (or equal to) the threshold, the tester 320 (or other control logic of the associated wire bonder) can determine that the wire bond of FIG. 3C was successfully formed (e.g., the bond wire was successful severed), and the wire bonding process can continue. If however, an open circuit (a resistance higher than, or at a threshold value) is not detected by the tester 320 with the cutter 312 positioned as shown in FIG. 3D, this can indicate a wire bonding failure, or a fault in an associated wire bonder. In this event, the wire bonder may, in response to a failure indication from the tester 320 and/or using its control logic, cease operation so that a root cause of the failure and/or fault can be determined and corrected.

Figure 4:
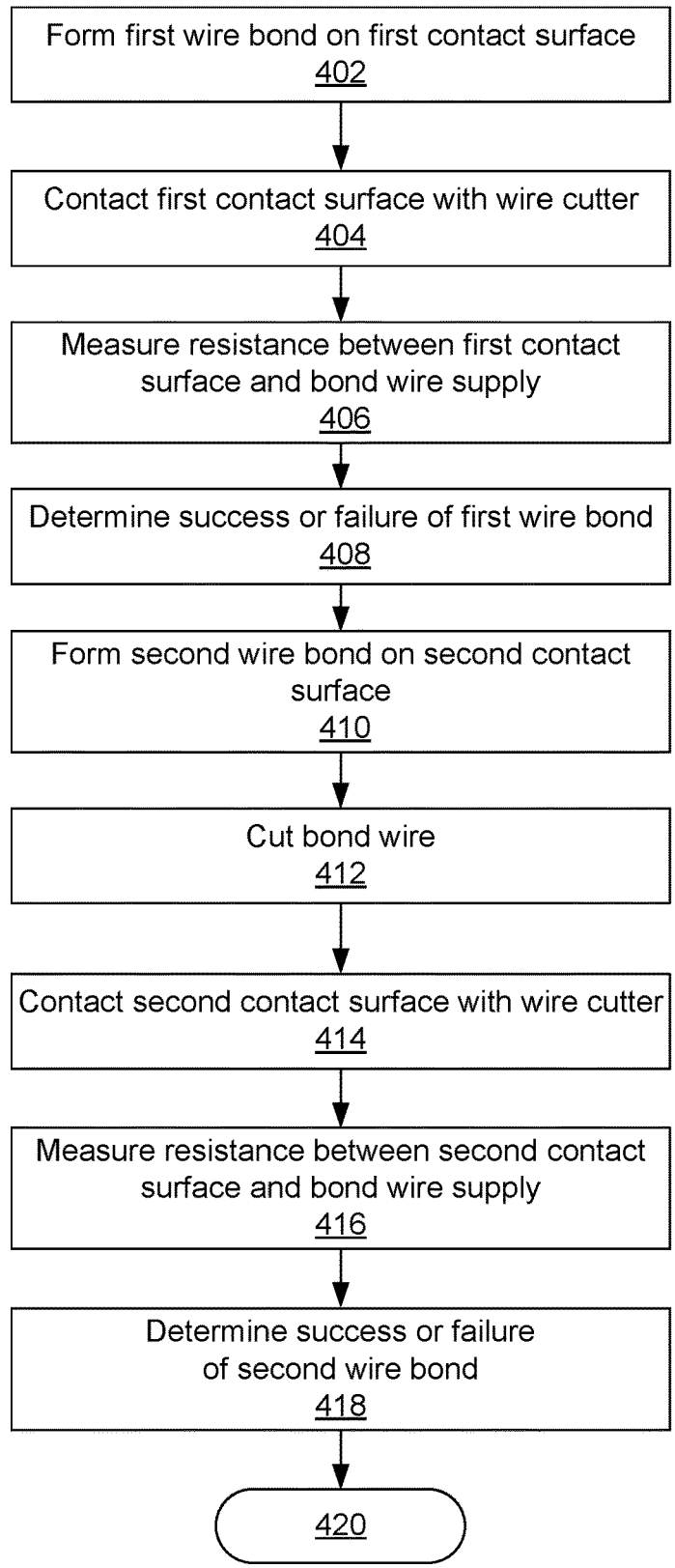
FIG. 4 is flowchart illustrating an example method.

FIG. 4 is a flowchart illustrating an example method 400. The method 400 can be used with one or more other examples described elsewhere herein. More or fewer operations than shown can be performed. Two or more operations can be performed in a different order unless otherwise indicated.

At operation 402, the method 400 can include forming, from a supply of bond wire included in a wire bonding apparatus (e.g., a wire bonder), a first wire bond of a bond wire electrical interconnect, where the first wire bond is formed on a first contact surface. At operation 404, the method 400 includes electrically contacting the first contact surface with a wire cutter included in a wire bonding head of the wire bonding apparatus, where the wire cutter is electrically conductive. In some implementations, the bonder head can be moved prior to the operation 404, so as to space the cutter from the bond wire (wire bond). At operation 406, the method 400 includes measuring, with a continuity tester included in the wire bonding apparatus, a resistance between the first contact surface and the supply of bond wire. At operation 408, the method 400 includes determining, based on the measured resistance between the first contact surface and the supply of bond wire being less than a first threshold resistance, success of the forming of the first wire bond, such as using the approaches described herein.

At operation 410, the method 400 includes, e.g., after moving the bonder head to a second contact surface and to form a wire loop of a bond wire electrical interconnect, forming, from the supply of bond wire, a last wire bond of the bond wire electrical interconnect, the last wire bond being formed on a second contact surface. The method 400 further includes, at operation 412, performing a wire cutting operation on the bond wire electrical interconnect and, at operation 414, electrically contacting the second contact surface with the wire cutter (e.g. after moving the bonder head to space the cutter from the bond wire). At operation 416, the method 400 includes measuring, with the continuity tester, a resistance between the second contact surface and the supply of bond wire. At operation 418, the method 400 includes determining, based on the measured resistance between the second contact surface and the supply of bond wire being greater than a second threshold resistance, success of the forming of the last wire bond.

At operation 420, zero, one or more operations can be performed. In some implementations, the method 400 can end at operation 420, e.g., after performing the operations 402-418. In some implementations, some or all of the operations 402-418 can be performed at the operation(s) 410 regarding forming other bond wire electrical interconnects including in-process testing of the associated wire bonds. In the method 400, similar to the wire bonding process described with respect to FIGS. 3A-3D, if success of a wire bond is not detected at operation 408 or 418 (e.g., a wire bond operation fails), the associated wire bonder may, in response to a failure indication from the tester and/or using its control logic, cease operation so that a root cause of the failure and/or fault can be determined and corrected.

The terms "substantially", "about" and "approximately" used throughout this Specification are used to describe and account for small fluctuations, such as due to variations in processing. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%. Also, when used herein, an indefinite article such as "a" or "an" means "at least one."

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

A number of implementations have been described. Nevertheless, it will be understood that various modifications may be made without departing from the spirit and scope of the specification.

In addition, the logic flows depicted in the figures do not require the particular order shown, or sequential order, to achieve desirable results. In addition, other processes may be provided, or processes may be eliminated, from the described flows, and other components may be added to, or removed from, the described systems. Accordingly, other implementations are within the scope of the following claims.

While certain features of the described implementations have been illustrated as described herein, many modifications, substitutions, changes and equivalents will now occur to those skilled in the art. It is, therefore, to be understood that appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A wire bonding apparatus comprising:
a supply of bond wire;
a wire bonding head including a wire cutter, the wire cutter being electrically conductive; and
an electrical continuity tester coupled between the supply of bond wire and the wire cutter, wherein the wire bonding apparatus is configured to:
after forming a wire bond on a contact surface, electrically contact the contact surface with the wire cutter; and
with the wire cutter electrically contacting the contact surface, measure a resistance between the contact surface and the supply of bond wire with the electrical continuity tester.

2. The wire bonding apparatus of claim 1, wherein the supply of bond wire is electrically coupled with an electrical ground.

3. The wire bonding apparatus of claim 2, wherein the supply of bond wire is electrically coupled with the electrical ground via a spool having the supply of bond wire disposed thereon.

4. The wire bonding apparatus of claim 2, wherein the supply of bond wire is electrically coupled with the electrical ground proximate the wire bonding head.

5. The wire bonding apparatus of claim 1, wherein:
the wire bond is a first wire bond of a bond wire electrical interconnect; and
the wire bonding apparatus is configured to indicate a wire bonding failure if the measured resistance is greater than a threshold resistance.

6. The wire bonding apparatus of claim 1, wherein:
the wire bond is a last wire bond of a bond wire electrical interconnect; and
the wire bonding apparatus is further configured to:
perform, with the wire cutter after formation of the wire bond, a wire cutting operation; and
indicate a wire bonding failure if the measured resistance is less than a threshold resistance.

7. A method for operating a wire bonding apparatus, the method comprising:
forming, from a supply of bond wire included in the wire bonding apparatus, a wire bond on a contact surface;
electrically contacting the contact surface with a wire cutter included in a wire bonding head of the wire bonding apparatus, the wire cutter being electrically conductive;
measuring, with a continuity tester included in the wire bonding apparatus, a resistance between the contact surface and the supply of bond wire; and
determining, based on the measured resistance, success or failure of the forming of the wire bond.

8. The method of claim 7, wherein:
the supply of bond wire is electrically coupled with electrical ground; and
measuring the resistance includes measuring a resistance between the wire cutter and electrical ground.

9. The method of claim 7, wherein:
the wire bond is a first wire bond of a bond wire electrical interconnect; and
determining success or failure of the forming of the wire bond includes:
- determining success of the forming of the wire bond if the measured resistance is less than or equal to a threshold resistance; and
- determining failure of the forming of the wire bond if the measured resistance is greater than the threshold resistance.

10. The method of claim 7, wherein:
the wire bond is a last wire bond of a bond wire electrical interconnect; and
determining success or failure of the forming of the wire bond includes:
- determining success of the forming of the wire bond if the measured resistance is greater than or equal to a threshold resistance; and
- determining failure of the forming of the wire bond if the measured resistance is less than the threshold resistance.

11. A method for operating a wire bonding apparatus, the method comprising:
- forming, from a supply of bond wire included in the wire bonding apparatus, a first wire bond of a bond wire electrical interconnect, the first wire bond being formed on a first contact surface;
- electrically contacting the first contact surface with a wire cutter included in a wire bonding head of the wire bonding apparatus, the wire cutter being electrically conductive;
- measuring, with a continuity tester included in the wire bonding apparatus, a resistance between the first contact surface and the supply of bond wire;
- determining, based on the measured resistance between the first contact surface and the supply of bond wire being less than a first threshold resistance, success of the forming of the first wire bond;
- forming, from the supply of bond wire, a last wire bond of the bond wire electrical interconnect, the last wire bond being formed on a second contact surface;
- performing a wire cutting operation on the bond wire electrical interconnect;
- electrically contacting the second contact surface with the wire cutter;
- measuring, with the continuity tester, a resistance between the second contact surface and the supply of bond wire; and
- determining, based on the measured resistance between the second contact surface and the supply of bond wire being greater than a second threshold resistance, success of the forming of the last wire bond.

12. The method of claim 11, further comprising:
after forming the first wire bond and prior to electrically contacting the first contact surface with the wire cutter, positioning a bonder head of the wire bonding apparatus such that the wire cutter is spaced from the first wire bond when electrically contacting the first contact surface.

13. The method of claim 11, further comprising:
after forming the last wire bond and prior to electrically contacting the second contact surface with the wire cutter, positioning a bonder head of the wire bonding apparatus such that the wire cutter is spaced from the last wire bond when electrically contacting the second contact surface.

14. The method of claim 11, wherein the supply of bond wire is electrically grounded.

* * * * *